United States Patent [19]
Connell et al.

[11] Patent Number: 5,634,202
[45] Date of Patent: May 27, 1997

[54] METHOD AND APPARATUS FOR INTEGRATING A PLURALITY OF ANALOG INPUT SIGNALS PRIOR TO TRANSMITTING A COMMUNICATIONS SIGNAL

[75] Inventors: Lawrence E. Connell, Naperville; Mark J. Callicotte, Oak Park; Kenneth R. Haddad, Arlington Heights, all of Ill.

[73] Assignee: Motorola, Inc., Schaumburg, Ill.

[21] Appl. No.: 149,486

[22] Filed: Nov. 9, 1993

[51] Int. Cl.$^6$ ................................. H04B 1/04
[52] U.S. Cl. .................. 455/110; 327/339; 327/361; 232/117
[58] Field of Search .................. 455/110, 102, 455/103, 105, 118, 119, 111, 112, 113; 375/76; 332/123, 117, 127, 128, 119; 307/490, 498, 529; 328/127, 14; 327/231, 339, 336, 355, 361, 327

[56] References Cited

U.S. PATENT DOCUMENTS

| | | | |
|---|---|---|---|
| 3,089,920 | 5/1963 | Law | 370/120 |
| 3,469,187 | 9/1969 | Kozlenko et al. | 327/339 |
| 3,949,324 | 4/1976 | Lowe et al. | 332/26 |
| 4,260,951 | 4/1981 | Lewyn | 328/165 |
| 4,554,508 | 11/1985 | Hague | 329/101 |
| 4,640,990 | 2/1987 | Kawade et al. | 379/77 |
| 4,823,360 | 4/1989 | Tremblay et al. | 375/4 |
| 4,940,988 | 7/1990 | Taylor, Jr. | 342/93 |
| 5,057,796 | 10/1991 | Winterer | 455/110 |
| 5,201,071 | 4/1993 | Webb | 455/103 |

OTHER PUBLICATIONS

Taub, Herbert and Schilling, Donald, *Principles of Communiciation Systems*, McGraw Hill Book Company, 1971, Section 4.3, pp. 116–118.

Carlson, Bruce, *Communication Systems*, McGraw–Hill Book Company, 1968, pp. 248–249.

*Primary Examiner*—Edward F. Urban
*Attorney, Agent, or Firm*—Daniel W. Jufernbruch

[57] ABSTRACT

A method and apparatus for integrating a plurality of analog input signals. A first integrator(725) having a first pole frequency integrates a first of the input signals and a second integrator(730) having a second pole frequency different than the first pole frequency integrates a second of the input signals. A summer(735) is connected to the first and second integrators to then sum the integrated first and second signals and provide a composite integrated signal prior to transmitting a communications signal.

13 Claims, 5 Drawing Sheets

METHOD AND APPARATUS FOR INTEGRATING A PLURALITY OF ANALOG INPUT SIGNALS PRIOR TO TRANSMITTING A COMMUNICATIONS SIGNAL

BACKGROUND OF THE INVENTION

1. Technical Field of the Invention

The present invention relates to signal processing and, more particularly, to the summation and integration of analog signals.

2. Description of the Related Art

The need to sum and integrate various analog signals is common in many applications. A common use is in frequency modulators, where several input signals need to be summed and integrated prior to introduction to a phase modulator. The integrator, however, has very high gain at DC, and most input signals will have a DC offset voltage associated with them. Hence, a technique for reducing DC offset levels is needed to prevent the circuit components in the integrator from saturating and to increase the dynamic range of the output signal.

A summer/integrator circuit is shown in FIG. 1 in accordance with the prior art. Two or more input signals 110 are first summed by the summer 115 as known in the art. The output of the summer 120 is tied to a DC blocking capacitor 130. Since a typical implementation of this circuit would be on an integrated circuit chip, and because the size required for the DC blocking capacitor would have be much larger than could be reasonably implemented on an integrated circuit chip, the DC blocking capacitor is a discrete capacitor, external to the integrated circuit chip. Connections from the DC blocking capacitor to the integrated circuit chip are provided by input and output pins 125 and 135 respectively. A resistor 140 is used to set the pole location for the high pass filter resulting from the resistor and the DC blocking capacitor. Finally, an integrator 150 as known in the art integrates the signal and provides an output signal 155.

BRIEF DESCRIPTION OF THE DRAWINGS

The many constructions and features of the present invention will become more apparent from the detailed description when read in conjunction with the following drawings.

DETAILED DESCRIPTION OF THE PREFERRED EMBODIMENTS

The present invention solves the above mentioned and other problems by providing the following and other features of the invention. Summing and integrating of a plurality of input signals are performed without requiring the use of a large DC blocking capacitor.

Figure 1:
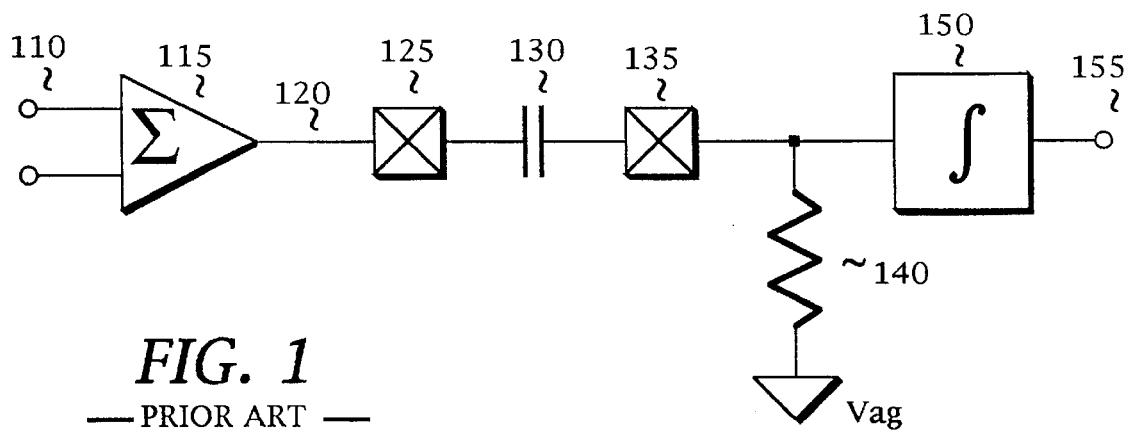
FIG. 1 illustrates a basic circuit diagram providing a summing and integrating function in accordance with the prior art.
Figure 2:
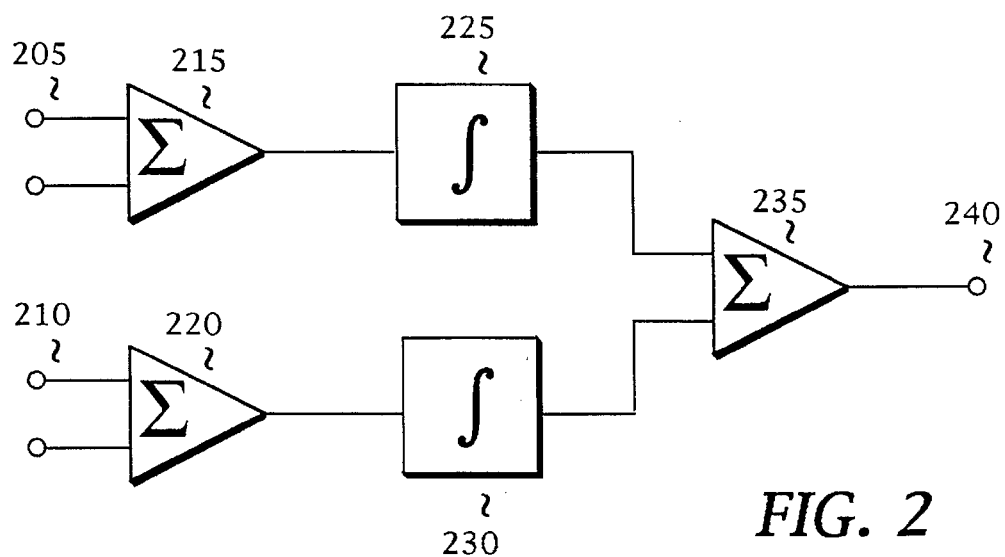
FIG. 2 illustrates a schematic block diagram of a circuit configuration according to the present invention.

In accordance with the present invention, there is provided a circuit configuration shown in FIG. 2. The input signals are grouped according to the frequency content present in each. Those with lower frequency content are grouped in input signal group 205 and those with higher frequency components are grouped in input signal group 210. The low frequency and high frequency groups are summed in summers 215 and 220 respectively. The summed low frequency signals are then integrated by a low pole frequency integrator 225, and the high frequency signals are integrated by a high pole frequency integrator 230. The outputs of both integrators are summed in summer 235 to be output at 240.

Both the high and low frequency input signal groups have DC voltage offsets associated with them. To remove the requirement for a DC blocking capacitor, one must reduce the effects of these DC voltage offsets. The present invention accomplishes this by setting the pole frequencies of the high and low frequency integrators in such a manner as to reduce the effect of these offsets. The present invention provides a fully integrated device for integrating a plurality of input signals. A large capacitance off-chip DC coupling capacitor is avoided. Further, two input/output pins from an integrated circuit are avoided.

Figure 3:
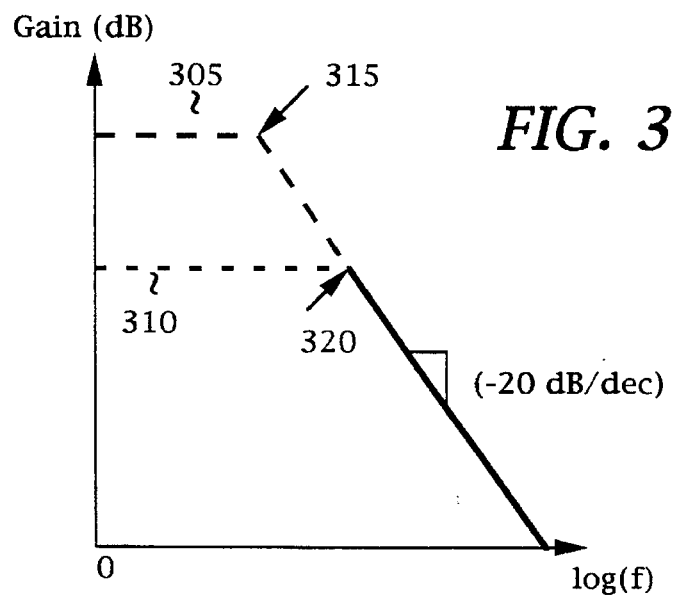
FIG. 3 illustrates a frequency response plot illustrating the frequency response of the integrators according to the present invention.

FIG. 3 illustrates a frequency response plot illustrating frequency characteristics of both the high and low pole frequency integrators. The low frequency group of input signals has frequency content that requires a low frequency pole 315 for the low frequency pole integrator. This pole determines the DC gain of the low frequency pole integrator 305. The high frequency group of input signals does not require this low frequency pole, so the high pole frequency integrator has a higher frequency pole 320. This permits the DC gain of the high pole frequency integrator 310 to be lower than that of the low pole frequency integrator. By reducing the gain of this integrator, the DC voltage offsets associated with the high frequency group of input signals are reduced. This eliminates the requirement for the DC blocking capacitor.

Figure 4:
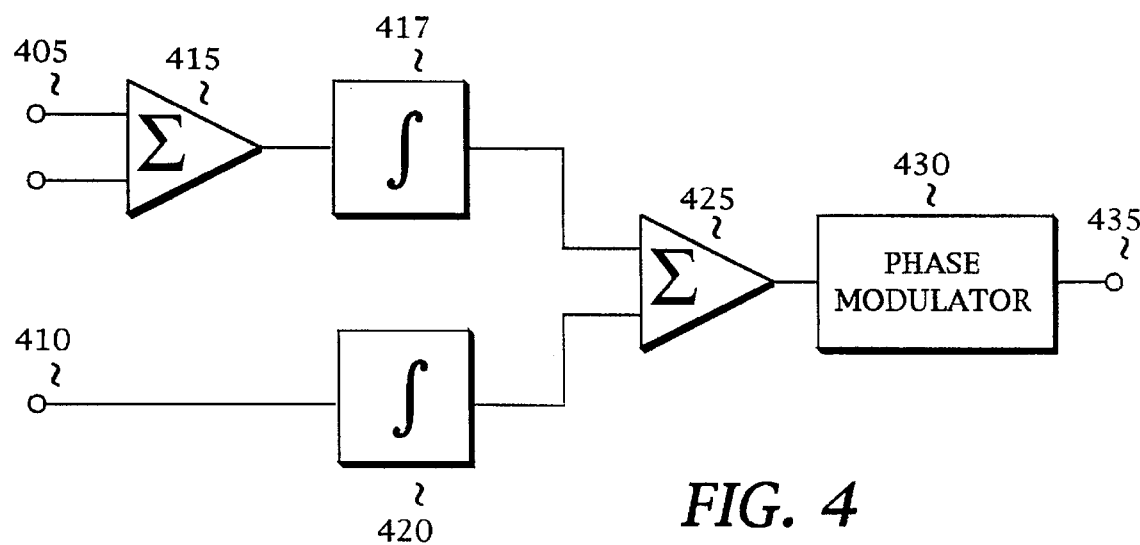
FIG. 4 illustrates a schematic block diagram of a frequency modulator according to the present invention.

FIG. 4 illustrates a frequency modulator constructed in accordance with the present invention. Three input signals are divided into a group 405 of two low frequency content signals 405 and a single high frequency content signal 410. In accordance with the present invention, any number of input signals or groups of input signals is possible. Depending on the frequency content of input signals, and the groups formed thereof, different configurations of multiple integrators, some with or without summing inputs, are possible.

Each integrator should have a pole frequency that matches the frequency of associated input signals. The low frequency content signals are summed together in summer 415 and the output of the summer is then integrated in integrator 417, which has a low pole frequency. The high frequency input is integrated in integrator 420, which has a high pole frequency. The two resulting integrated signals are summed in summer 425, and the output of the summer is then fed to a phase modulator 430. The phase modulator 430 is combined with the integrating and summing to perform frequency modulation of signals with low frequency content. The output of the phase modulator 435 is a frequency modulated signal, modulated by the sum of the input signals.

Figure 5A:
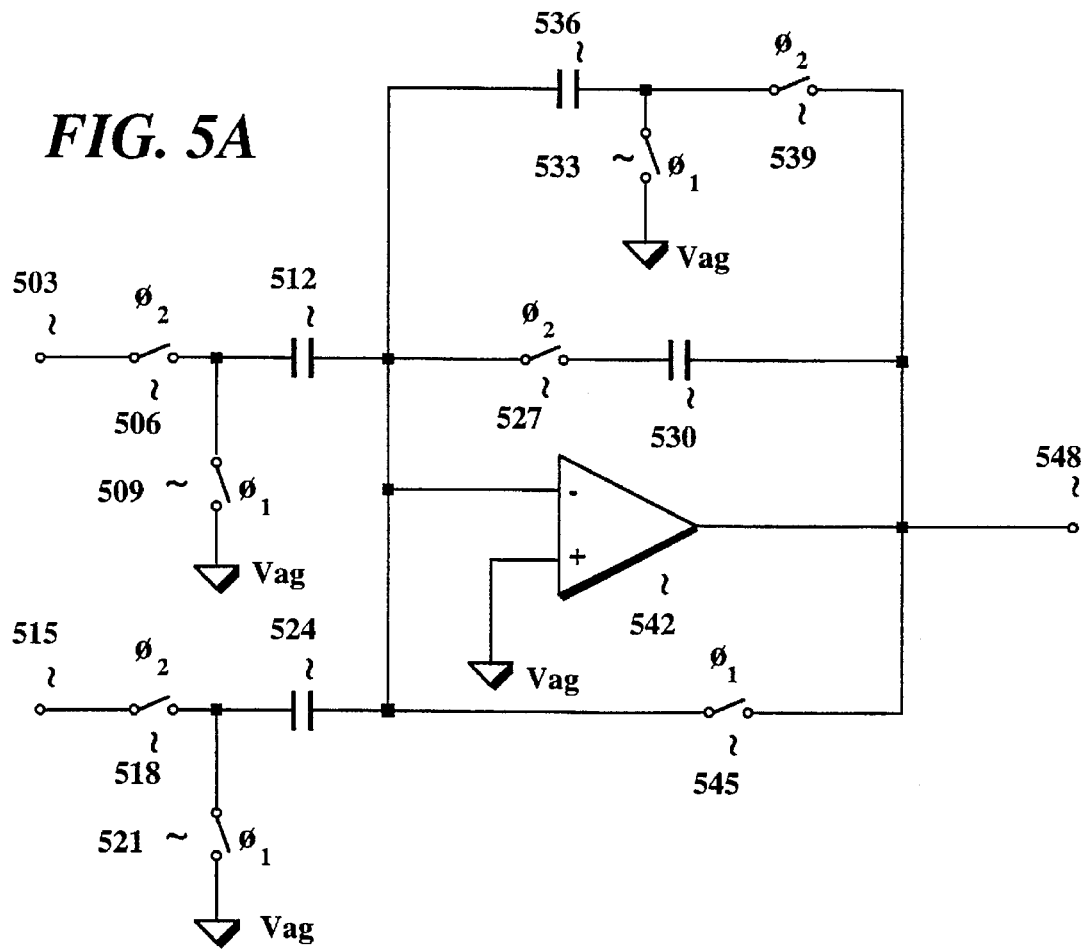
FIGS. 5A, 5B and 6 illustrate a schematic diagram providing a switched capacitor circuit configuration according to the present invention.
Figure 5B:
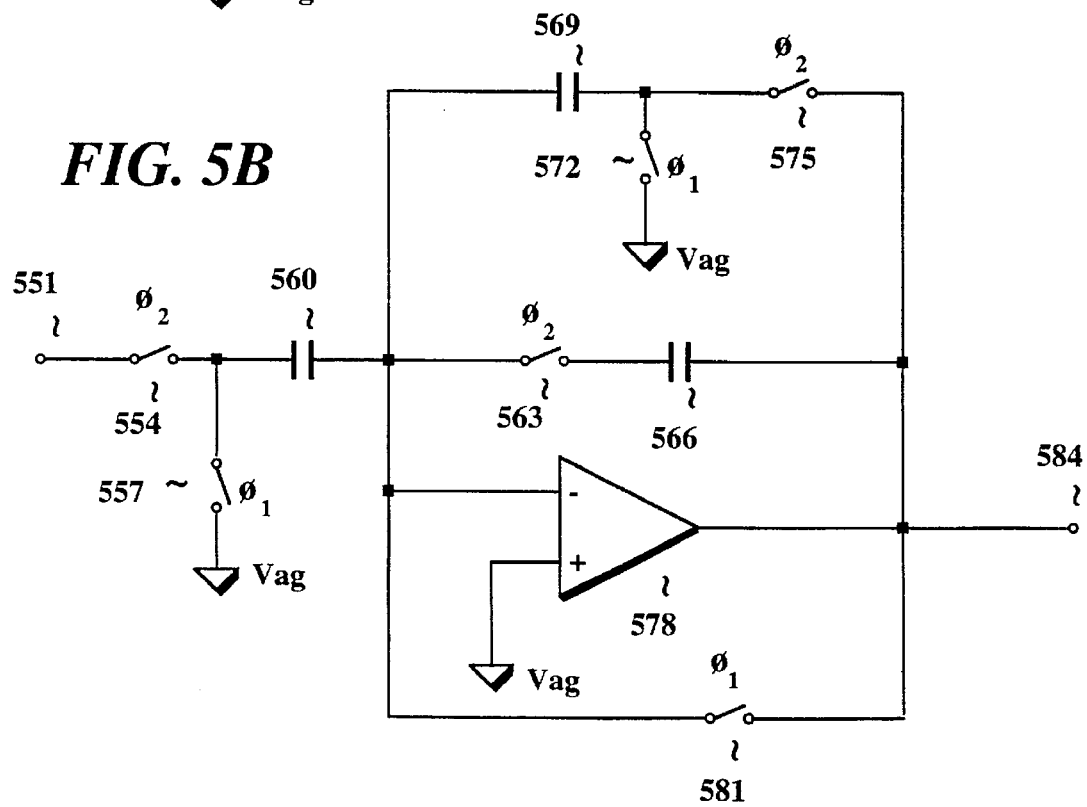
Figure 6:
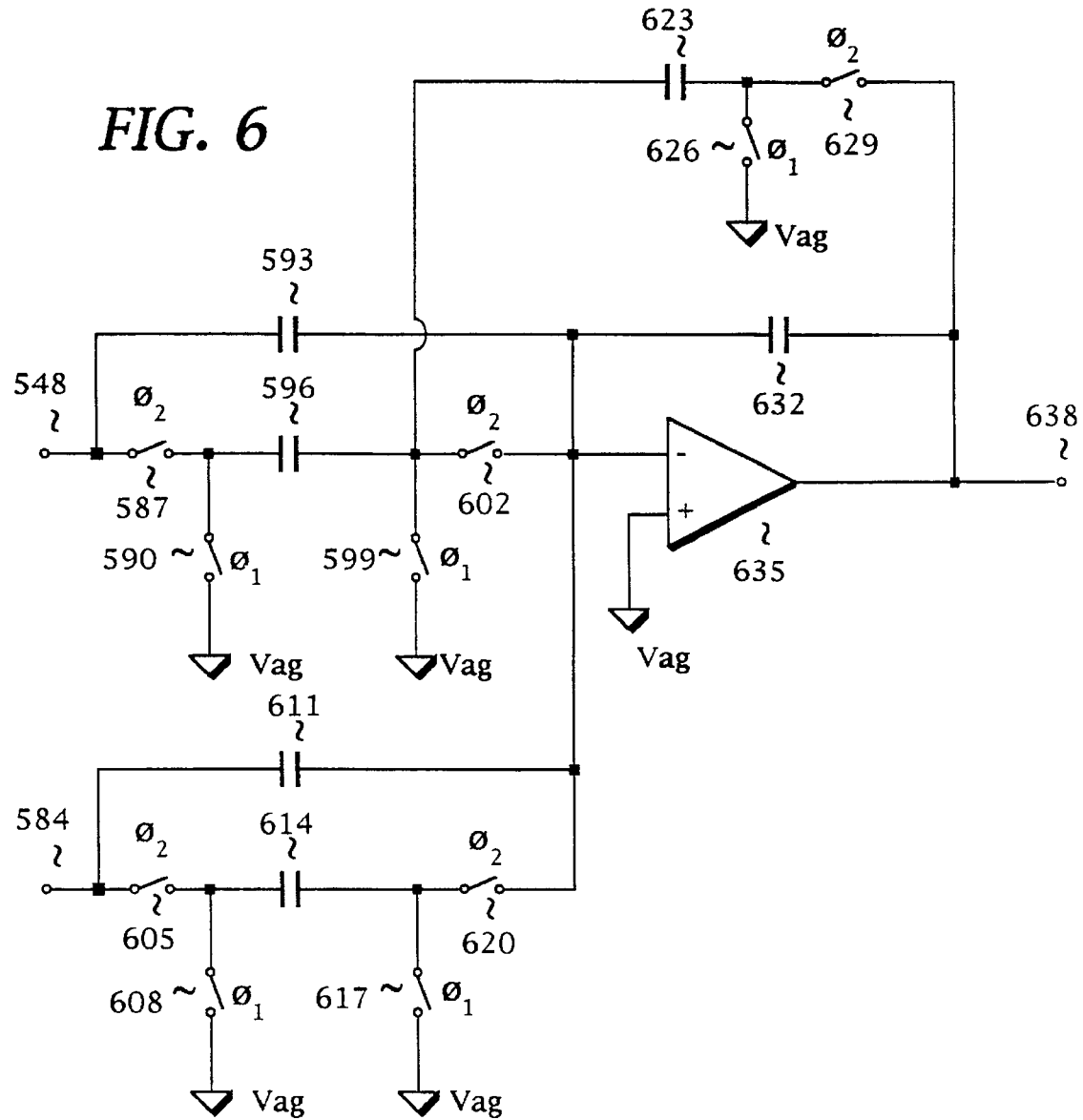

FIGS. 5A, 5B, and 6 show a switched capacitor circuit configuration according to the present invention. The elements of a switched capacitor circuit are switches, which may be N- or P-Type MOSFETS or a combination of both, capacitors and operational amplifiers, all of whose design is known in the art. For many implementations, a summer for summing a group of input signals may be combined with the input portion of an integrator circuit to provide a single circuit as shown in FIGS. 5A and 5B.

In FIGS. 5A and 5B two integrators are illustrated, a first integrator with a summing input and a second integrator with a single (non-summing) input, such as that illustrated in FIG. 4. The low frequency content input signals 503 and 515 are first introduced into the circuit through respective switches 506 and 518. The switches 506 and 518 are activated by a bi-phase clock ø, which originates from a source (not illustrated). The source can be internal to a device such as a radio transmitter. The bi-phase clock ø is non-overlapping and has two phases indicated as $ø_1$ and $ø_2$. The input signals 503 and 515 are sampled onto input capacitors 512 and 524 respectively. On $ø_1$, switches 509, 521 and 545 are closed to clear the input capacitors of charge. The input samples are integrated onto integrator capacitor 530 during clock phase $ø_2$, when switches 506, 518 and 527 are closed. Negative feedback is provided by feedback capacitors 536 and 530. The output is sampled onto feedback capacitor 536 on clock phase $ø_2$ when switch 539 is closed. Switches 533 and 545 clear the feedback capacitor 536 for the next output sample. The pole frequency of the integrator is determined by the ratio of the feedback capacitor 536 to the integrating capacitor 530. The DC gain of each input signal is determined by the ratio of the respective input capacitor 512 or 524 to the feedback capacitor 536.

Switch 545 is an auto-zero switch that permits cancellation of the input referred offset voltage of the operational amplifier 542. By shorting the output 548 of the amplifier 542 to its input during $ø_1$, the offset voltage is sampled onto the input capacitors 512 and 524 and the feedback capacitor 536. During $ø_2$, the stored offset voltage is then subtracted from amplifier 542, and thus its offset is canceled.

The second integrator shown in FIGS. 5A and 5B is similar to the first integrator. However, a summing input is not provided on the input of the second integrator. The input signal 551 is sampled through switch 554 onto input capacitor 560. This capacitor is cleared by switches 557 and 581. The input signal is integrated onto integrating capacitor 566 through switch 563. The output signal 584 is fed back through feedback capacitor 569 through switch 575 and integrating capacitor 566. Feedback capacitor 569 is cleared by switches 572 and 581. The auto-zero switch 581 permits cancellation of the input referred offset of operational amplifier 578.

The z-domain transfer function of a lossy switched capacitor integrator, such as those in FIG. 5, is given by:

$$H(z) = \frac{-M}{R + Q - R^*z^{-1}} \quad \text{EQU. 1}$$

where:

M=input capacitance
R=integrating capacitance
Q=switching feedback capacitance

The input signals will be a combination of a DC offset and a desired signal as shown below:

$V_{503}$=Input Signal at 503=$V_{503-DC}$+$V_{503-SIG}$
$V_{515}$=Input Signal at 515=$V_{515-DC}$+$V_{515-SIG}$
$V_{551}$=Input Signal at 551=$V_{551-DC}$+$V_{551-SIG}$ where:

$V_{n-DC}$=DC Offset present in input signal n
$V_{n-SIG}$=Desired signal present in input signal n
n=503, 515, 548, 551 and 584

Applying EQU.1 to the input signals yields:

$$V_{548-SIG} = \frac{-M_{512}*V_{503-SIG}}{R_{530} + Q_{536} - R_{530}*z^{-1}} + \frac{-M_{524}*V_{515-SIG}}{R_{530} + Q_{536} - R_{530}*z^{-1}}$$

$$V_{548-DC} = \frac{-M_{512}*V_{503-DC}}{Q_{536}} + \frac{-M_{524}*V_{515-DC}}{Q_{536}}$$

and:

$$V_{584-SIG} = \frac{-M_{560}*V_{551-SIG}}{R_{566} + Q_{569} - R_{566}*z^{-1}}$$

$$V_{584-DC} = \frac{-M_{560}*V_{551-DC}}{Q_{569}}$$

where the ratios $$\frac{-M_{512}}{Q_{536}}, \frac{-M_{524}}{Q_{536}} \text{ and } \frac{-M_{560}}{Q_{569}}$$

are the DC gains of the input signal paths through their respective integrators. Since the DC gain of the higher pole integrator is significantly reduced relative to the gain of the lower pole integrator, the output DC offset contribution of the high pole integrator due to input signal 551 is significantly reduced as well. It is this reduction in offset that permits one to remove the large external DC blocking capacitor used in the prior art.

FIGS. 5A, 5B and 6 can be implemented on a single integrated circuit chip. The sizes of capacitors associated with the integrators will depend on many variables. As an example, for ø having a frequency of 32 kHz, the first integrator having a pole of 1 Hz, the second integrator having a pole of 15 Hz, the first integrator having a DC gain of 15 and the second integrator having a DC gain of 1, the sizes of the capacitors are computed as follows. The fabrication of capacitors as small as 0.01 picofarad (pf) is known in the art. For sampling frequencies which are much greater than the integrator pole frequencies, the equivalent resistance of a switched capacitor is approximately given by:

$$R_{eq} = \frac{1}{F_s*C}$$

where $R_{eq}$=Equivalent resistance
$F_s$=Clock frequency of ø
C=Capacitance of the switched capacitor For a 1 Hz pole, the ratio between the integrating capacitor and the feedback capacitor can be determined by solving:

$$1 \text{ Hz} = \frac{1}{2*\pi*R_{eq}*R_1}$$

where $$R_{eq} = \frac{1}{F_s*Q_1}$$

$R_1$=Capacitance of the integrating capacitor for the first integrator $Q_1$=Capacitance of the switching feedback capacitor for the first integrator this yields:

$$\frac{R_1}{Q_1} = \frac{F_s}{2*\pi}$$

The DC gain of an integrator is determined by the ratio of the input capacitor, M, to that of the switching feedback capacitor, Q.

DC Gain=M/Q the first integrator, setting $Q_1$=0.01 pf and applying the above method will result in $R_1$=50.93 pf and $M_1$=0.15 pf, where $M_1$ is the input capacitor for the first integrator.

Similarly, for the second integrator, where $Q_2$, $R_2$ and $M_2$ are the feedback, integrating and input capacitance, respectively, setting $Q_2$=0.01 pf and applying the above method results in $R_2$=3.40 pf and $M_2$=0.01 pf. In this manner, the total summed capacitance of both integrator stages is approximately 55 pf.

For some applications, it is important that the gains for each integrator closely track one another so that the relative input signal levels are maintained through the integration. By implementing the multiple integrators on the same integrated circuit with matching switched capacitor integrators, the required matching accuracy is easily achieved.

FIG. 6 shows a switched capacitor implementation of the summer circuit. The summer is a two input all pass stage. The outputs of the integrators 548 and 584 are directly fed into continuous time capacitors, 593 and 611, as well as being sampled onto switched capacitors, 596 and 614 respectively. Input switches 587 and 605 sample the output of the integrators onto the switched input capacitors while switches 602 and 620 permit charge to be transferred to the summing node of the operational amplifier 635. Switches 590, 599, 608 and 617 discharge the input samples from the switched input capacitors. The output signal 638 is stored on capacitor 632 and the output signal is fed back using feedback capacitors 623 and 632 and switches 626 and 629. The z-domain transfer function of the summer is given by:

$$H(z) = \frac{-(M+P) + (P*z^{-1})}{R + Q - R*z^{-1}}$$

where:

M=switching input capacitance

P=continuous input capacitance

R=integrating capacitance

Q=switching feedback capacitance

An examination of the above equation shows that if:

P/R=M/Q then the pole and zero exactly cancel, yielding a flat frequency response with gain of:

Gain=P/R=M/Q

Figure 7:
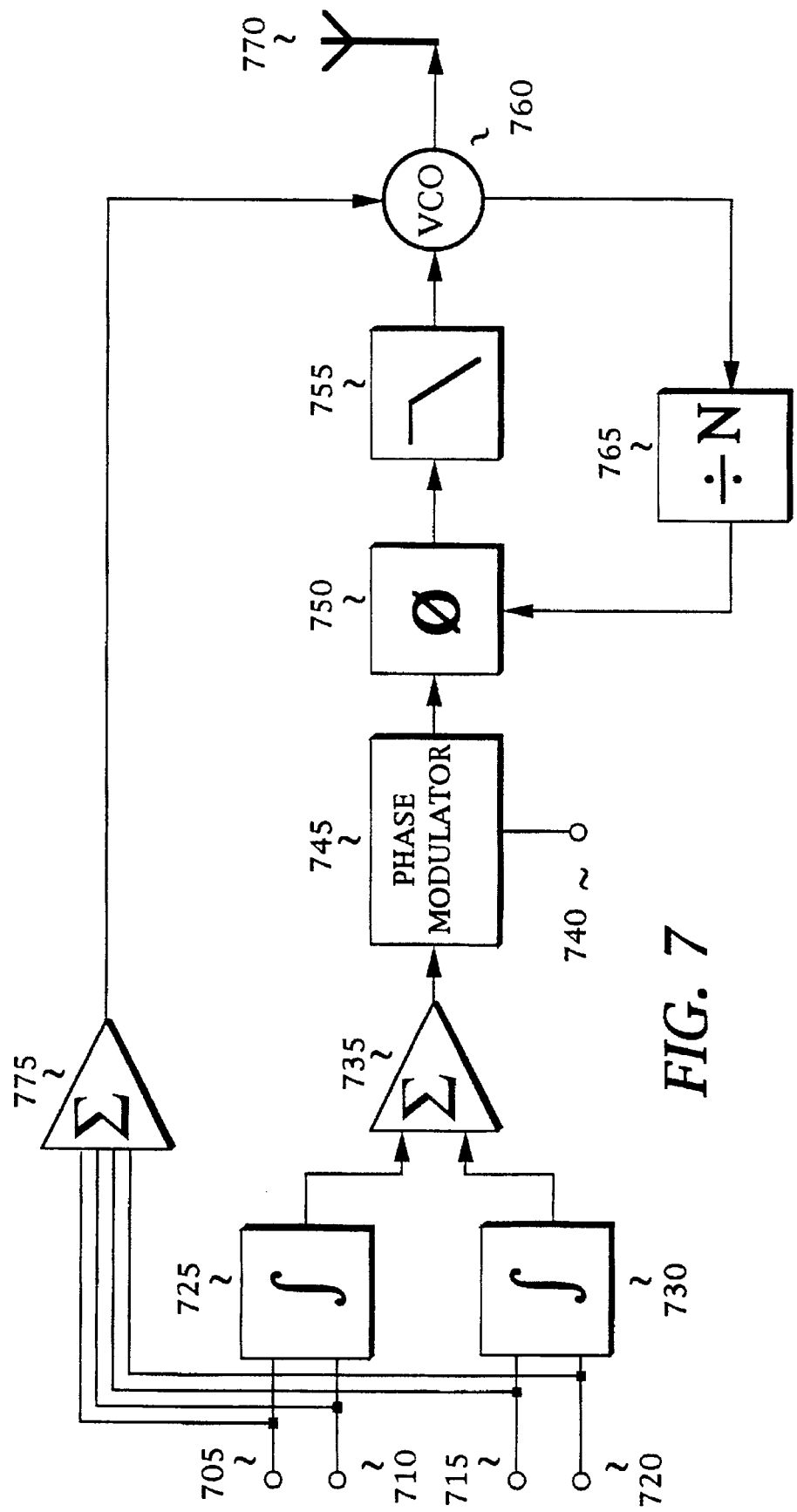
FIG. 7 illustrates a schematic block diagram of a radio transmitter constructed according to the present invention.

A further possible embodiment of the present invention illustrates a radio transmitter in FIG. 7. A low frequency data signal 705 with a frequency content in a range of 50 Hz to 100 Hz and an auxiliary input signal 710 with frequency content in a range of 10 Hz to 10 kHz are introduced into a summer/integrator 725 with a pole frequency of 1 Hz. A voice signal 715 with frequency content in a range of 300 Hz to 3 kHz and a DTMF signal 720 with frequency content in a range of 600 Hz to 1600 Hz is introduced into a summer/integrator 730 with a pole frequency of 15 Hz. The resulting outputs of the 1 Hz pole and 15 Hz pole integrators are summed in summer 735. The summed output of the summer 735 is introduced to a phase modulator 745. The phase modulator 745 modulates the reference signal 740 based on the summed output signal of summer 735. This modulated signal is then fed to a frequency synthesizer made of a phase detector circuit 750, a low pass filter 755, a voltage controlled oscillator 760 and a divider 765. Both groups of input signals are also summed together in summer 775 and fed to the voltage controlled oscillator to provide direct frequency modulation of its output. The output of the frequency synthesizer is then transmitted on a transmitting element 770, such as an antenna.

Although the invention has been described and illustrated in the above description and drawings, it is understood that this description is by example only and that numerous changes and modifications can be made by those skilled in the art without departing from the true spirit and scope of the invention. Different groups of input signals can be handled by different configurations of summing and single input integrators. The invention can also be implemented in whole or in part in a digital signal processor instead of in analog signal processing circuits.

What is claimed is:

1. An apparatus for integrating a plurality of input signals to provide a frequency modulated signal, comprising:

a first integrator having a first pole frequency to integrate at least one input signal and provide a first integrated signal wherein said first integrator comprises a first switched capacitor integrator;

a second integrator having a second pole frequency different than the first pole frequency to integrate at least another input signal and provide a second integrated signal wherein said second integrator comprises a second switched capacitor integrator;

a summer operatively coupled to said first integrator and said second integrator to receive the first and second integrated signals and provide a composite integrated signal; and a phase modulator operatively coupled to said summer to receive the composite integrated signal from said summer and provide a frequency modulated signal.

2. An apparatus according to claim 1, wherein at least one of said first and second integrators comprises means for summing a first group of the input signals to provide the respective first or second of the input signals.

3. An apparatus according to claim 1, wherein the first and second input signals have a different frequency content; and wherein said first and second integrators have poles corresponding to the frequency content of the first and second input signals.

4. An apparatus according to claim 1, wherein said first integrator, said second integrator and said summer are integrated on at least one integrated circuit substrate.

5. An apparatus according to claim 4, wherein said first and second integrators on the at least one integrated circuit substrate have a sum total capacitance of less than about 60 picofarads.

6. An apparatus for integrrating a plurality of input signals comprising:

a first integrator having a first pole frequency to integrate at least one first input signal and provide a first integrated signal;

a second integrator having a second pole frequency different than the first pole frequency to integrate at least another second input signal and provide a second integrated signal; and a summer operatively coupled to said first integrator and said second integrator to receive the first and second integrated signals and provide a composite integrated signal;

wherein the first input signal comprises low frequency data signals and the second input signal comprises voice signals and wherein said first integrator, said second integrator and said summer are integrated on at least one integrated circuit substrate.

7. An apparatus for integrating a plurality of input signals to provide a frequency modulated signal, comprising:

a first integrator having a first pole frequency to integrate at least one input signal and provide a first integrated signal;

a second integrator having a second pole frequency different than the first pole frequency to integrate at least another input signal and provide a second integrated signal;

a summer operatively coupled to said first integrator and said second integrator to receive the first and second integrated signals and provide a composite integrated signal;

a phase modulator operatively coupled to said summer to receive the composite integrated signal from said summer and provide a frequency modulated signal; and a frequency synthesizer operatively coupled to said phase modulator to receive the frequency modulated signal from said phase modulator and to frequency synthesize a carrier frequency for radio transmission by said apparatus using the frequency modulated signal as a reference frequency for said frequency synthesizer.

8. An apparatus for providing a frequency modulated signal, comprising:

a first integrator to integrate at least a first of a plurality of input signals and provide a first integrated signal wherein said first integrator comprises a first switched capacitor integrator;

a second integrator to integrate at least a second of the plurality of input signals and provide a second integrated signal wherein said second integrator comprises a second switched capacitor integrator;

a summer operatively coupled to said first integrator and said second integrator to receive the first and second integrated signals and provide a composite integrated signal; and a phase modulator operatively coupled to receive the composite integrated signal from said summer and provide a frequency modulated signal.

9. An apparatus according to claim 8, further comprising a frequency synthesizer operatively coupled to receive the frequency modulated signal from said phase modulator and to frequency synthesize a carrier frequency using the frequency modulated signal as a reference frequency.

10. A radio transmitter having a frequency modulator comprising an integrator and a phase modulator operatively coupled thereto, said radio transmitter comprising first integrator means for integrating at least one input signal with a first pole frequency to provide a first integrated signal;

second integrator means for integrating at least one other input signal with a second pole frequency different than the first pole frequency to provide a second integrated signal;

summer means for summing the first and second integrated signals to provide a composite integrated signal;

a phase modulator operatively coupled to receive the composite integrated signal from said summer means and provide a frequency modulated signal; and a frequency synthesizer operatively coupled to said phase modulator to receive the frequency modulated signal from said phase modulator and to frequency synthesize a carrier frequency for radio transmission by said radio transmitter using the frequency modulated signal as a reference frequency for said frequency synthesizer.

11. A method of summing and integrating a plurality of input signals to provide a frequency modulated signal, comprising the steps of:

(a) integrating at least one of the plurality of input signals comprising low frequency data signals and voice signals by integrating at least the low frequency data signals to provide a first integrated signal;

(b) integrating at least one other of the plurality of input signals with a different time constant than said step (a) by integrating at least the voice signals to provide a second integrated signal;

(c) summing the first and second integrated signals provided in said steps (a) and (b) to provide a composite integrated signal; and (d) phase modulating the composite integrated signal from said step (c) and providing a frequency modulated signal.

12. A method according to claim 11, wherein at least one of said steps (a) or (b) comprises a substep of summing a first group of the plurality of input signals.

13. A method according to claim 11, wherein the integrating in said step (b) is performed with a different time constant than the integrating in said step (a) by using a different pole frequency.

* * * * *